United States Patent
Mochida

(10) Patent No.: US 7,456,492 B2
(45) Date of Patent: Nov. 25, 2008

(54) SEMICONDUCTOR DEVICE HAVING SEMICONDUCTOR ELEMENT, INSULATION SUBSTRATE AND METAL ELECTRODE

(75) Inventor: Akira Mochida, Toyota (JP)

(73) Assignee: DENSO CORPORATION, Kariya (JP)

( * ) Notice: Subject to any disclaimer, the term of this patent is extended or adjusted under 35 U.S.C. 154(b) by 169 days.

(21) Appl. No.: 11/634,862

(22) Filed: Dec. 7, 2006

(65) Prior Publication Data

US 2007/0145540 A1 Jun. 28, 2007

(30) Foreign Application Priority Data

Dec. 26, 2005 (JP) .............................. 2005-371815

(51) Int. Cl.
*H01L 23/552* (2006.01)
(52) U.S. Cl. ........................ 257/659; 257/706; 257/707
(58) Field of Classification Search ................. 257/659, 257/706, 707, 713, 718, 719
See application file for complete search history.

(56) References Cited

U.S. PATENT DOCUMENTS

| | | | |
|---|---|---|---|
| 6,072,240 A | 6/2000 | Kimura et al. | |
| 6,448,645 B1 | 9/2002 | Kimura et al. | |
| 6,703,707 B1 | 3/2004 | Mamitsu et al. | |
| 7,106,592 B2 | 9/2006 | Inoue et al. | |
| 7,384,863 B2 * | 6/2008 | Shibata | 438/614 |
| 2007/0040250 A1 * | 2/2007 | Kajiwara et al. | 257/673 |

FOREIGN PATENT DOCUMENTS

| | | |
|---|---|---|
| GB | 2 051 474 | 4/1980 |
| JP | A-61-240665 | 10/1986 |
| JP | A-2001-217351 | 8/2001 |
| JP | A-2003-007703 | 1/2003 |
| JP | A-2003-068953 | 3/2003 |
| JP | A-2003-124410 | 4/2003 |
| JP | A-2005-217248 | 8/2005 |

OTHER PUBLICATIONS

Office Action dated Feb. 27, 2008 in corresponding German Patent Application No. 10 2006 059 501.7-33 (and English translation).

* cited by examiner

*Primary Examiner*—Phuc T Dang
(74) *Attorney, Agent, or Firm*—Posz Law Group, PLC

(57) ABSTRACT

A semiconductor device includes: first and second metal electrodes having inner surfaces facing each other; a semiconductor element sandwiched between the electrodes; and first and second insulation substrates disposed on the electrode and opposite to the semiconductor element, respectively. Each of the insulation substrates is made of ceramics. At least one of the electrodes includes a plurality of layers stacked in a direction parallel to a stacking direction. One layer disposed on a semiconductor element side has a thermal expansion coefficient, which is higher than that of another layer disposed on an insulation substrate side.

14 Claims, 3 Drawing Sheets

SEMICONDUCTOR DEVICE HAVING SEMICONDUCTOR ELEMENT, INSULATION SUBSTRATE AND METAL ELECTRODE

CROSS REFERENCE TO RELATED APPLICATION

This application is based on Japanese Patent Application No. 2005-371815 filed on Dec. 26, 2005, the disclosure of which is incorporated herein by reference.

FIELD OF THE INVENTION

The present invention relates to a semiconductor device having a semiconductor element, an insulation substrate and a metal electrode.

BACKGROUND OF THE INVENTION

A structure having the semiconductor element, the pair of metallic electrodes and the insulating substrate is formerly proposed as the semiconductor device in U.S. Pat. No. 6,072,240. The metallic electrode is arranged so as to nip (i.e., sandwich) the semiconductor element, and functions as an electrode of the semiconductor element and a heat radiating member. The insulating substrate is arranged on a face on a side opposed to a nipping face of the semiconductor element in each metallic electrode and has a heat radiating property and is manufactured by ceramic.

In this structure, the semiconductor element is formed in a shape arranged so as to be nipped by both the metallic electrodes on opposite faces of both the opposed metallic electrodes, i.e., on an inner face side. The semiconductor element can take out an electric signal by the metallic electrode from both faces of the semiconductor element.

Further, an outer face of each metallic electrode is brazed to the insulating substrate, and a cooling device is attached to the outer face side of each insulating substrate so that heat can be radiated from the semiconductor element from its both faces. Here, an electric insulating property of the metallic electrode and the cooling device is secured by the insulating substrate manufactured by ceramic.

However, the former semiconductor device causes the problem that the insulating substrate is warped by a temperature cycle change, etc. due to a difference in coefficient of thermal expansion between the insulating substrate constructed by ceramic and the metallic electrode constructed by a metal.

For example, when the warp of the insulating substrate is large, problems are caused in that a close attaching property of the cooling device and the insulating substrate becomes insufficient, and an assembly property in nipping the semiconductor device by the cooling device is obstructed by deterioration of a parallel degree between both the insulating substrates, etc.

SUMMARY OF THE INVENTION

In view of the above-described problem, it is an object of the present disclosure to provide a fuel injection nozzle.

According to an aspect of the present disclosure, a semiconductor device includes: first and second metal electrodes having heat radiation property, wherein inner surfaces of metal electrodes face each other; a semiconductor element sandwiched between the first and second metal electrodes, wherein the semiconductor element is electrically connected to both inner surfaces of the electrodes; and first and second insulation substrates having heat radiation property, wherein the first insulation substrate is disposed on the first metal electrode, and opposite to the semiconductor element, and wherein the second insulation substrate is disposed on the second metal electrode, and opposite to the semiconductor element. Each of the first and second insulation substrates is made of ceramics. At least one of the first and second metal electrodes includes a plurality of layers, which are stacked in a direction parallel to a stacking direction of the electrodes, the semiconductor element and the insulation substrates. One layer disposed on a semiconductor element side has a thermal expansion coefficient, which is higher than that of another layer disposed on an insulation substrate side.

In the above device, warpage of the insulation substrate is limited, the warpage caused by difference of thermal expansion coefficient between the insulation substrate and the metal electrode.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

Figure 1:
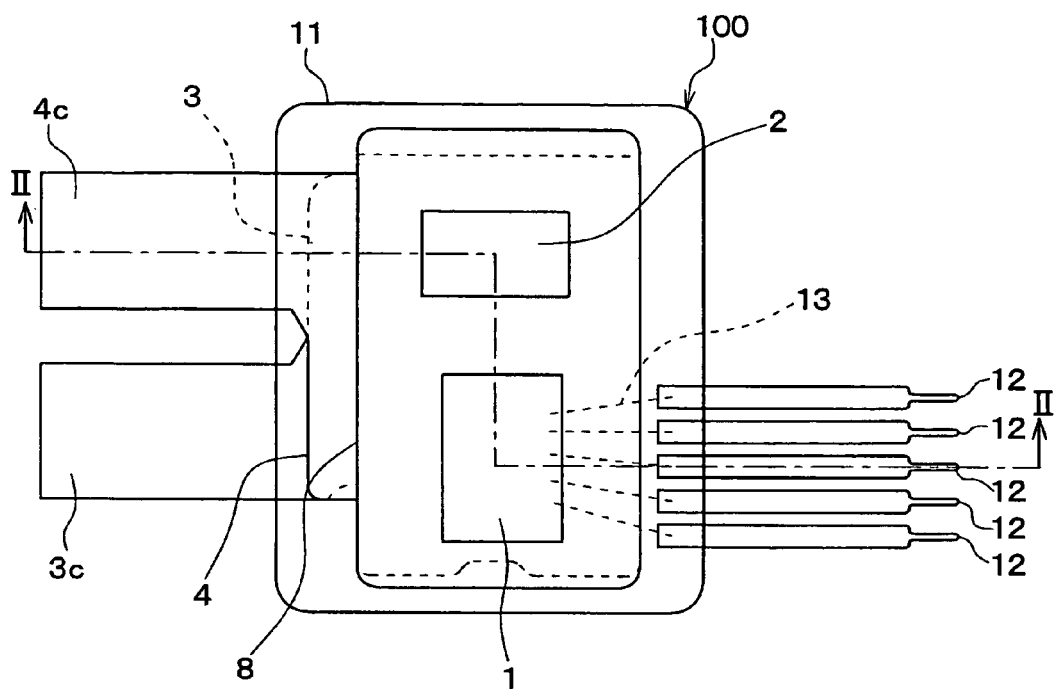
FIG. 1 is a plan view showing a semiconductor device according to a first embodiment.
Figure 2:
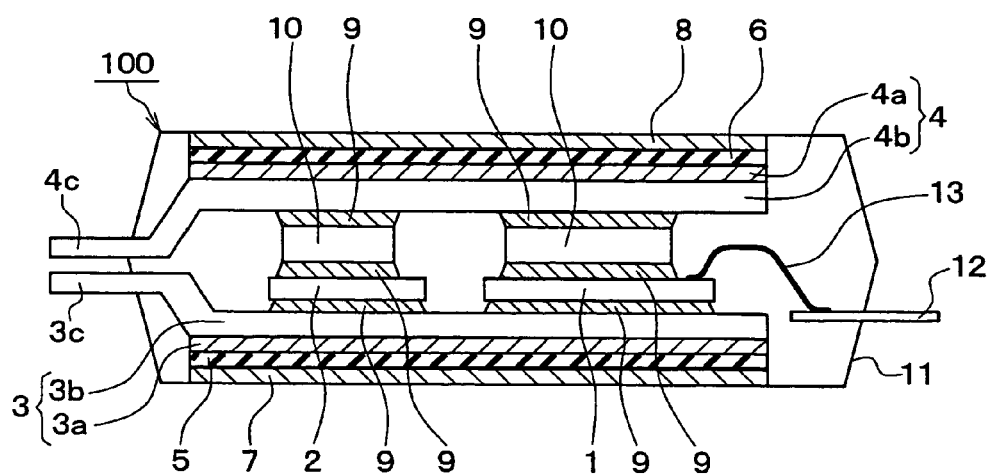
FIG. 2 is a cross sectional view showing the device taken along line II-II in FIG. 2.

FIG. 1 is a view showing the schematic planar construction of a semiconductor device 100 in accordance with a first embodiment mode. FIG. 1 is also a view showing the construction of a planar arrangement of each portion within a resin mold 11 in this semiconductor device 100. Further, FIG. 2 is a schematic cross-sectional view along line II-II within FIG. 1. In each of the following cross-sectional views, hatching is partially omitted since each portion is not easily discriminated and distinguished when the hatching is performed in sections of all members.

For example, this semiconductor device 100 is mounted to a vehicle such as an automobile, etc., and is applied as a device for operating various kinds of electronic devices for a vehicle.

As shown in FIGS. 1 and 2, this semiconductor device 100 has two semiconductor elements 1, 2 arranged in a plane. In this example, a first semiconductor element 1 is IGBT (insulating gate type bipolar transistor) 1, and a second semiconductor element 2 is FWD (flywheel diode) 2.

Both faces of both these semiconductor elements 1, 2 are nipped by a first metallic electrode 3 and a second metallic electrode 4 as a pair. Namely, the pair of metallic electrodes 3, 4 is arranged such that mutual inner faces are opposed. The semiconductor elements 1, 2 are arranged so as to be nipped by both these metallic electrodes 3, 4 and are electrically connected to the inner faces of both the metallic electrodes 3, 4.

This pair of metallic electrodes 3, 4 has an electrically conductive property and a heat radiating property, and functions as electrodes of the semiconductor elements 1, 2 and heat radiating members.

Further, as shown in FIG. 2, a first insulating substrate 5 having the heat radiating property and manufactured by ceramic is arranged on an outer face of the first metallic electrode 3, i.e., on a face on a side opposed to nipping faces of the semiconductor elements 1, 2. A second insulating substrate 6 having the heat radiating property and manufactured by ceramic is arranged on an outer face of the second metallic electrode 4, i.e., on a face on the side opposed to the nipping faces of the semiconductor elements 1, 2.

Further, metallic layers 7, 8 are arranged in a state electrically insulated from the metallic electrodes 3, 4 on outer faces of the insulating substrates 5, 6, i.e., on faces on sides opposed to the sides of the metallic electrodes 3, 4 in each of the first insulating substrate 5 and the second insulating substrate 6.

In this embodiment mode, each of the metallic electrodes 3, 4 has a laminating structure in which plural layers 3a, 3b, 4a, 4b are laminated in a low order of coefficient of thermal expansion from the outer face side as the sides of the insulating substrates 5, 6 to the inner face side as the sides of the semiconductor elements 1, 2.

In this example, the laminating structure of each of the metallic electrodes 3, 4 is constructed by two layers which are formed by insulating substrate side layers 3a, 4a located on the sides of the insulating substrates 5, 6, and are also formed by element side layers 3b, 4b located on the sides of the semiconductor elements 1, 2 and having a coefficient of thermal expansion greater than that of the insulating substrate side layers 3a, 4a.

Concretely, the first metallic electrode 3 is formed by laminating the insulating substrate side layer 3a constructed by an iron system metal such as pure iron, cast iron, etc., and the element side layer 3b constructed by copper, a copper alloy, aluminum, an aluminum alloy, etc. from the outer face side as the side of the first insulating substrate 5.

On the other hand, the second metallic electrode 4 is formed by laminating the insulating substrate side layer 4a constructed by an iron system metal such as pure iron, cast iron, etc., and the element side layer 4b constructed by copper, a copper alloy or aluminum, an aluminum alloy, etc. from the outer face side as the side of the second insulating substrate 6. Further, in this example, the element side layers 3b, 4b are thicker than the insulating substrate side layers 3a, 4a in the respective metallic electrodes 3, 4.

In this connection, the coefficient of thermal expansion is $0.138 \times 10^{-4}$/K in pure iron, and is $0.162 \times 10^{-4}$/K in copper, and is $0.237 \times 10^{-4}$/K in aluminum. The metallic electrodes 3, 4 of a plate shape formed by laminating such metals of different kinds can be manufactured by integrating metallic plates of different kinds by brazing and activation joining.

Further, a normal ceramic substrate of alumina, aluminum nitride, silicon nitride, etc. can be adopted in each of the insulating substrates 5, 6. Similar to the element side layers 3b, 4b, the metallic layers 7, 8 arranged on the outer faces of the respective insulating substrates 5, 6 are constructed by copper, aluminum, etc. Further, in this embodiment mode, the metallic layers 7, 8 and the insulating substrates 5, 6 have the same planar size in the respective insulating substrates 5, 6.

Three members constructed by the first metallic electrode 3, the first insulating substrate 5 and the metallic layer 7, and three members constructed by the second metallic electrode 4, the second insulating substrate 6 and the metallic layer 8 are respectively joined and integrated by brazing and activation joining between the respective members.

Further, the metallic electrodes 3, 4 located on the inner face sides of the insulating substrates 5, 6 and the metallic layers 7, 8 located on the outer face sides are not limited in concrete thickness in the respective insulating substrates 5, 6. However, the metallic electrodes 3, 4 are preferably thicker than the metallic layers 7, 8.

Further, as shown in FIG. 2, in this semiconductor device 100, a portion between one face of both the semiconductor elements 1, 2 and the inner face of the first metallic electrode 3, i.e., the element side layer 3b is electrically and thermally connected by an electrically conductive joining member 9 such as solder, an electrically conductive adhesive, etc.

Further, a heat sink block 10 constructed by copper, aluminum, etc. is interposed between the other face of both the semiconductor elements 1, 2 and the inner face of the second metallic electrode 4, i.e., the element side layer 4b. A portion between each of the semiconductor elements 1, 2 and the heat sink block 10, and a portion between the heat sink block 10 and the second metallic electrode 4 are electrically and thermally connected by the electrically conductive joining member 9.

As shown in FIGS. 1 and 2, the pairs of metallic electrodes 3, 4 and insulating substrates 5, 6 nipping the semiconductor elements 1, 2 are sealed by resin mold 11 in this semiconductor device 100. This resin mold 11 is constructed by epoxy resin, etc., and is formed by die molding.

Further, as shown in FIG. 2, each of the metallic layers 7, 8 is exposed from the resin mold 11 in each of the pair of insulating substrates 5, 6.

Thus, this semiconductor device 100 is constructed such that heat is radiated through the respective metallic electrodes 3, 4, the respective insulating substrates 5, 6, the respective metallic layers 7, 8 and the heat sink block 10 on each of both faces of the first and second semiconductor elements 1, 2.

Further, the pair of metallic electrodes 3, 4 is electrically connected to unillustrated electrodes of the respective faces of both the semiconductor elements 1, 2 through the electrically conductive joining member 9 and the heat sink block 10.

Here, as shown in FIGS. 1 and 2, plural terminals 3c, 4c, 12 electrically connected to the semiconductor elements 1, 2 are arranged in the semiconductor device 100. Each of these terminals 3c, 4c, 12 is sealed in the resin mold 11 such that one portion of each of these terminals 3c, 4c, 12 is exposed from the resin mold 11. Each of these terminals 3c, 4c, 12 is a part electrically connected to the exterior.

In this example, the first metallic electrode 3 and the second metallic electrode 4 in the pair of metallic electrodes 3, 4 respectively become an electrode of the collector side of the IGBT 1 as the first semiconductor element 1 and an electrode of the cathode side of the FWD 2 as the second semiconductor element 2, and an electrode of the emitter side of the IGBT 1 and an electrode of the anode side of the FWD 2.

The collector lead as the terminal 3c among the above respective terminals is molded integrally with the first metallic electrode 3, and is projected and exposed outside the resin mold 11 from an end face of the first metallic electrode 3. Further, the emitter lead as the terminal 4c is molded integrally with the second metallic electrode 4, and is projected and exposed outside the resin mold 11 from an end face of the second metallic electrode 4.

Here, in this embodiment mode, as shown in FIG. 2, these leads 3c, 4c are molded integrally with the element side layers 3b, 4b located on the inner face side among the respective metallic electrodes 3, 4. The insulating substrate side layers 3a, 4a located on the outer face side among the respective metallic electrodes 3, 4 are located within the resin mold 11.

Namely, in this embodiment mode, only the layers 3b, 4b located on the innermost face side and near the semiconductor elements 1, 2 in the respective metallic electrodes 3, 4 are projected outside the resin mold 11, and their projecting portions are constructed as the terminals 3c, 4c for electric connection with the exterior. In the example shown in FIG. 2, these terminals 3c, 4c are bent in the exterior of the resin mold 11, but may be also straight without bending and processing these terminals 3c, 4c.

Further, as shown in FIGS. 1 and 2, a terminal 12 constructed by a lead frame separated from the metallic electrodes 3, 4 among the above respective terminals is a control terminal 12 arranged in the circumference of the IGBT 1 within the resin mold 11.

This control terminal 12 is constructed as a gate terminal of the IGBT 1 and various kinds of terminals for inspections, etc. The IGBT 1 is electrically connected to the control terminal 12 through a bonding wire 13 of gold, aluminum, etc.

In such a construction, the heat sink block 10 interposed between the second metallic electrode 4 and the semiconductor elements 1, 2 secures the height between a wire bonding face of the IGBT 1 and the second metallic electrode 4 to maintain the height of the wire 13 in performing wire bonding of this IGBT1 and the control terminal 12.

Such a semiconductor device 100 can be manufactured by preparing a work formed by integrating the respective semiconductor elements 1, 2, the heat sink block 10 and the wire-bonded control terminal 12, and sequentially nipping upper and lower portions of this work by the respective metallic electrodes 3, 4, the respective insulating substrates 5, 6 and the respective metallic layers 7, 8, and then performing resin sealing.

This semiconductor device 100 can be also manufactured by preparing a structure formed by integrating the metallic electrodes 3, 4, the insulating substrates 5, 6 and the metallic layers 7, 8 in advance so that the resin sealing is performed after the upper and lower portions of the above work are nipped.

In accordance with this embodiment mode, with respect to the respective metallic electrodes 3, 4, the plural layers 3a, 3b, 4a, 4b are laminated in a low order of coefficient of thermal expansion from the outer face side as the sides of the insulating substrates 5, 6 to the inner face side as the sides of the semiconductor elements 1, 2. Therefore, in the respective metallic electrodes 3, 4, the coefficients of thermal expansion of the insulating substrate side layers 3a, 4a as parts of the sides of the insulating substrates 5, 6 can be set to be small.

Thus, thermal deformation of the insulating substrate side layers 3a, 4a abutting on the insulating substrates 5, 6 manufactured by ceramic can be restrained, and the difference in coefficient of thermal expansion between the insulating substrates 5, 6 and the insulating substrate side layers 3a, 4a abutting on these insulating substrates 5, 6 can be further reduced. Accordingly, in accordance with this semiconductor device 100, a warp of the insulating substrates 5, 6 due to the difference in coefficient of thermal expansion between the metallic electrodes 3, 4 and the insulating substrates 5, 6 can be restrained.

As mentioned above, the semiconductor device of this kind normally promotes heat radiation by nipping the semiconductor device by an unillustrated cooling device constructed by a block, etc. of aluminum, copper, etc., and making the outer face side of the insulating substrate and this cooling device come in contact with each other. In this semiconductor device 100, the above cooling device comes in contact with the metallic layers 7, 8 arranged on the outer faces of both the insulating substrates 5, 6.

Therefore, if the warp of the insulating substrates 5, 6 is restrained as in this semiconductor device 100, a close attaching area of the metallic layers 7, 8 and the above cooling device is easily secured, and it also becomes easy to secure a parallel degree when the semiconductor device 100 is nipped by the cooling device.

Further, in this embodiment mode, only the element side layers 3b, 4b located on the innermost face side among the metallic electrodes 3, 4 are electrically connected to the exterior. The insulating substrate side layers 3a, 4a located on the outermost face side and constructed by an iron system metal comparatively inferior in electrically conductive property are not used as a member for making electric connection with the exterior.

Since the element side layers 3b, 4b among the metallic electrodes 3, 4 are nearest to the semiconductor elements 1, 2, the element side layers 3b, 4b mainly bear a function as electrodes of the semiconductor elements 1, 2. Therefore, as mentioned above, copper and aluminum good in electrically conductive property are used. Therefore, electric connection of the semiconductor elements 1, 2 and the exterior can be suitably realized by conducting only these element side layers 3b, 4b to the exterior.

Further, in this embodiment mode, the metallic layers 7, 8 are arranged on the outer face as the sides opposed to the sides of the metallic electrodes 3, 4 of the respective insulating substrates 5, 6. These metallic layers 7, 8 attain a state electrically insulated from the metallic electrodes 3, 4 by interposing the insulator of insulating substrates 5, 6.

For example, when the first insulating substrate 5 is set to an example in FIG. 2, it becomes a shape in which the first metallic electrode 3 is arranged on the inner face of the first insulating substrate 5 and the metallic layer 7 is arranged on the outer face. Therefore, stress due to the difference in coefficient of thermal expansion between the inner face side of the first insulating substrate 5 and the first metallic electrode 3 is applied to this inner face side. However, stress due to the difference in coefficient of thermal expansion between the outer face side and the metallic layer 7 is simultaneously applied to this outer face side. Thus, the difference in thermal stress between both the inner and outer faces becomes small.

Therefore, even when a temperature cycle is applied in the first insulating substrate 5, it is expected that thermal stress due to this temperature cycle is relaxed and no first insulating substrate 5 is easily deformed. Matters similar to these matters can be also said with respect to the second insulating substrate 6.

Further, in this embodiment mode, in a construction for nipping the respective insulating substrates 5, 6 by the metallic electrodes 3, 4 and the metallic layers 7, 8 in this way, the metallic electrodes 3, 4 able to flow a large electric current to the semiconductor elements 1, 2 are realized by setting the metallic electrodes 3, 4 to be thicker than the metallic layers 7, 8. Further, it is advantageous in heat radiating property by setting the metallic layers 7, 8 to be thinner.

In the above example, the metallic layers 7, 8 are arranged in both the insulating substrates 5, 6. However, a construction for arranging the metallic layer in only one insulating substrate and arranging no metallic layer in the other insulating substrate may be also set in accordance with necessity.

Second Embodiment Mode

Figure 3:
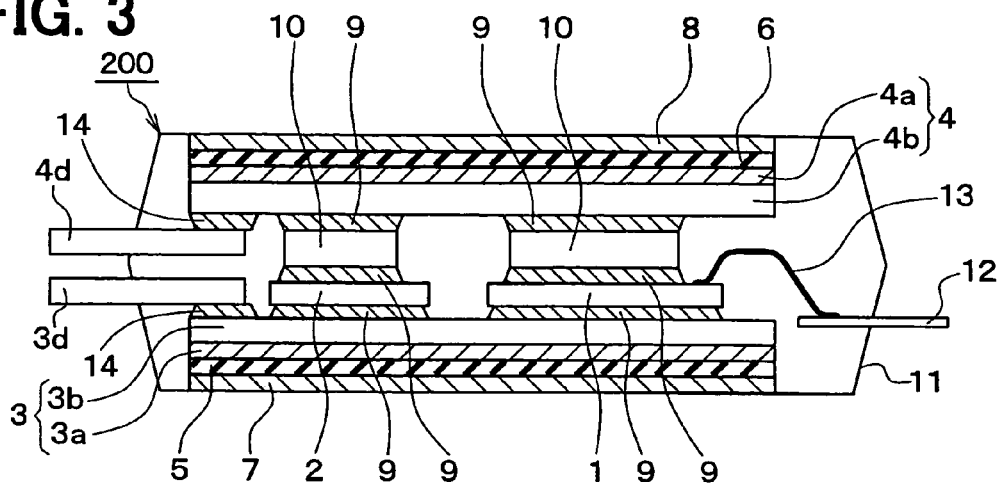
FIG. 3 is a cross sectional view showing a semiconductor device according to a second embodiment.

FIG. 3 is a view showing the schematic sectional construction of a semiconductor device 200 in accordance with a second embodiment mode. In this semiconductor device 200, portions corresponding to the leads 3c, 4c in the semiconductor device 100 shown in the above first embodiment mode are modified, and the others are similar.

In the above first embodiment mode, only the element side layers 3b, 4b as layers located on the innermost face side among the respective metallic electrodes 3, 4 are projected outside the resin mold 11, and their projecting portions are constructed as the leads 3c, 4c as terminals.

In this embodiment mode, similar to the above first embodiment mode, only the element side layers 3b, 4b among the metallic electrodes 3, 4 are electrically connected to the exterior. However, in this embodiment mode, as shown in FIG. 3, the element side layers 3b, 4b are connected to conductor members 3d, 4d separated from these element side layers 3b, 4b by an electrically conductive joining member 14.

Here, the respective element side layers 3b, 4b are connected to the respective conductor members 3d, 4d within the resin mold 11. Each of the respective conductor members 3d, 4d is projected from the resin mold 11 so that connection with the exterior can be made.

Namely, in this embodiment mode, these conductor members 3d, 4d correspond to the respective leads 3c, 4c of the emitter and the collector in the above first embodiment mode. For example, these conductor members 3d, 4d are constructed by a conductor such as copper, aluminum, etc.

Further, similar to the above electrically conductive joining member 9 for connecting portions between the semiconductor elements 1, 2, the heat sink block 10 and the metallic electrodes 3, 4, solder, an electrically conductive joining member, a brazing material, etc. can be adopted in the electrically conductive joining member 14 for connecting these conductor members 3d, 4d.

Third Embodiment Mode

Figure 4:
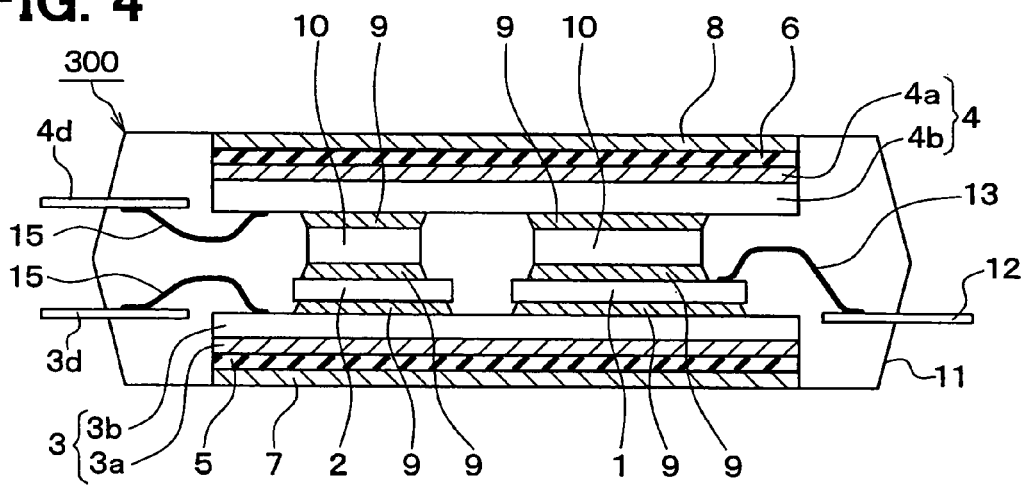
FIG. 4 is a cross sectional view showing a semiconductor device according to a third embodiment.

FIG. 4 is a view showing the schematic sectional construction of a semiconductor device 300 in accordance with a third embodiment mode. In this semiconductor device 300, a connecting means of the conductor members 3d, 4d and the element side layers 3b, 4b in the semiconductor device 200 shown in the above second embodiment mode is changed, and the others are similar.

In the above second embodiment mode, the conductor members 3d, 4d and the element side layers 3b, 4b are connected by the electrically conductive joining member 14. However, in this embodiment mode, as shown in FIG. 4, this connection is made by a bonding wire 15 instead of this electrically conductive joining member 14. Similar to the above wire 13 for connecting the control terminal 12 and the IGBT 1, this wire 15 can be constructed by gold, aluminum, etc.

The terminal structure relative to the metallic electrodes 3, 4 in the above first to third embodiment modes shows a case in which both the metallic electrodes 3, 4 as a pair become the same terminal structure. However, in accordance with necessity, the terminal structures of these respective embodiment modes may be also combined such that one of the pair of metallic electrodes 3, 4 and the other become different terminal structures.

For example, the first metallic electrode 3 may be also set to a terminal structure integrated with the element side layers 3b, 4b as in the above first embodiment mode, and the second metallic electrode 4 may be also set to a construction for setting the separated conductor body 4d to a terminal through the electrically conductive joining member 14 as in the above second embodiment mode.

Fourth Embodiment Mode

Figure 5:
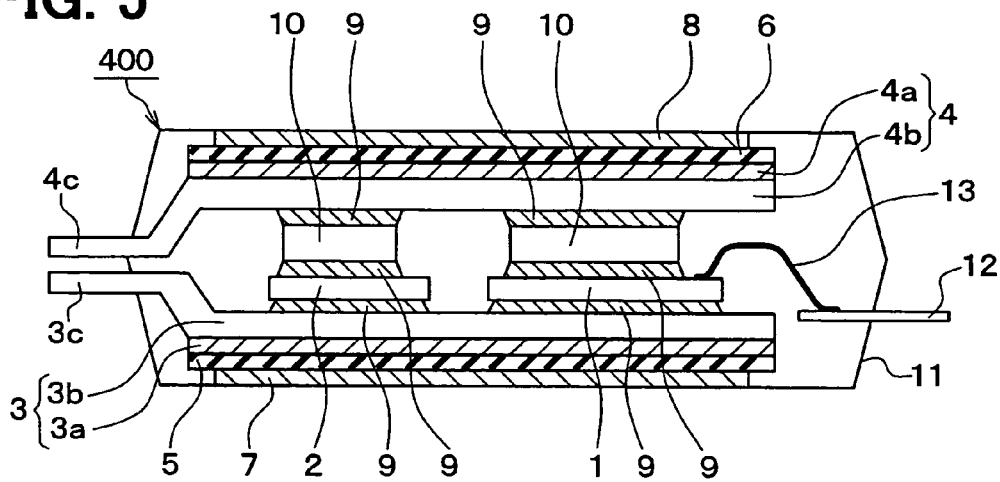
FIG. 5 is a cross sectional view showing a semiconductor device according to a fourth embodiment.
Figure 6:
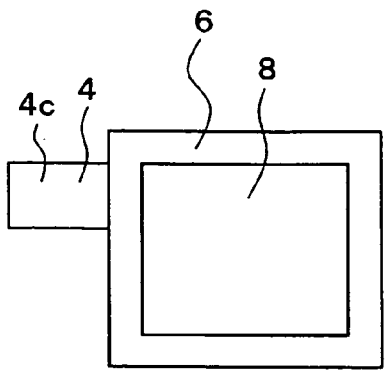
FIG. 6 is a plan view showing a second metallic electrode on a second insulating substrate in the device shown in FIG. 5.

FIG. 5 is a view showing the schematic sectional construction of a semiconductor device 400 in accordance with a fourth embodiment mode. FIG. 6 is a schematic top view of a second metallic electrode 4, a second insulating substrate 6 and a metallic layer 8 in this semiconductor device 400.

In each of the above embodiment modes, as shown in each of the above figures, the same size as the planar size of the metallic layers 7, 8 is set in each of the insulating substrates 5, 6. In contrast to this, as shown in FIGS. 5 and 6, in the semiconductor device 400, the metallic layers 7, 8 are set to be smaller in planar size than the insulating substrates 5, 6, and be located within the ranges of the insulating substrates 5, 6.

FIG. 6 shows a planar construction of the second insulating substrate 6 side. However, the planar construction of the first insulating substrate 5 side is also substantially similar to that of FIG. 6. Namely, in each of the first insulating substrate 5 and the second insulating substrate 6, the respective metallic layers 7, 8 are located within the ranges of the insulating substrates 5, 6 as shown in FIG. 6.

Circumferential portions of the insulating substrates 5, 6 are formed in a shape projected outside outer circumferential end portions of the metallic layers 7, 8 by adopting the relation of such a planar size. Therefore, in the respective insulating substrates 5, 6, it is possible to lengthen the creepage distances between the metallic layers 7, 8 and the metallic electrodes 3, 4 through end faces of the insulating substrates 5, 6.

Accordingly, in accordance with this embodiment mode, in the respective insulating substrates 5, 6, it is possible to improve an electric insulating property of the metallic electrodes 3, 4 and the metallic layers 7, 8 located on both faces of the insulating substrates 5, 6.

In this example, the planar size of the metallic layers 7, 8 is set to be small in both the insulating substrates 5, 6. However, in accordance with necessity, it may be also set to a construction in which the planar size of the metallic layer is set to be small in only one insulating substrate, and the planar size of the metallic layer is set to the same size as the insulating substrate in the other insulating substrate.

Further, this embodiment mode can be executed by changing the size of the metallic layers 7, 8, and can be applied to each of the above first to third embodiment modes.

Fifth Embodiment Mode

Figure 7:
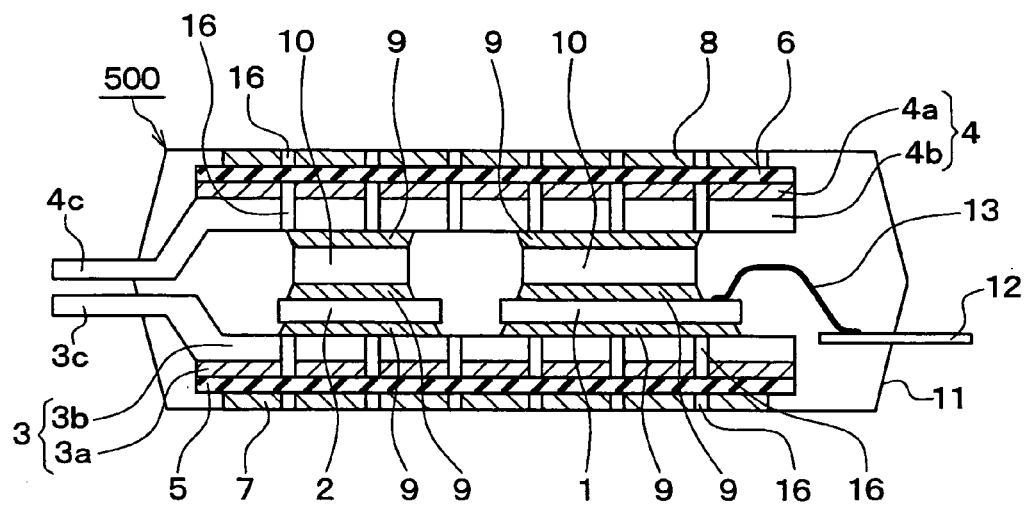
FIG. 7 is a cross sectional view showing a semiconductor device according to a fifth embodiment.
Figure 8A:
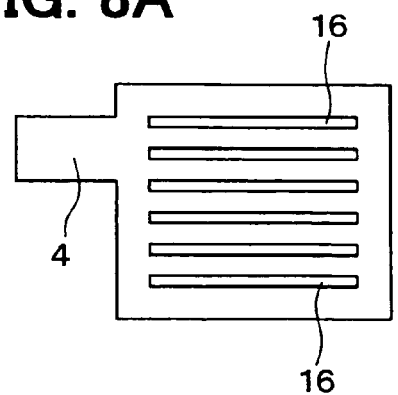
FIG. 8A is a plan view showing a second metallic electrode.
Figure 8B:
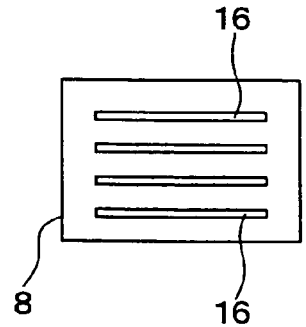
FIG. 8B is a metallic layer in the device shown in FIG. 7.

FIG. 7 is a view showing the schematic sectional construction of a semiconductor device 500 in accordance with a fifth embodiment mode. FIGS. 8A and 8B are respectively a schematic plan view of a simplex of a second metallic electrode 4, and a schematic plan view of a simplex of a metallic layer 8 arranged in a second insulating substrate 6 in this semiconductor device 500.

In this embodiment mode, the schematic planar construction of the simplex of the first metallic electrode 3 and the schematic planar construction of the simplex of the metallic layer 7 arranged in the first insulating substrate 5 in the semiconductor device 500 are similar to those of FIGS. 8A and 8B.

In this embodiment mode, as shown in FIGS. 7 and 8, a slit 16 is arranged in the metallic electrodes 3, 4 and the metallic layers 7, 8. Here, the slit 16 is formed in the shape of an elongated opening hole. In the illustrated example, plural slits 16 are arranged, but one slit 16 may be also arranged. Further, no pattern of the slit 16 is limited to the illustrated example.

Thermal stress generated in the metallic electrodes 3, 4 and the metallic layers 7, 8 can be relaxed by arranging the slit 16 in the metallic electrodes 3, 4 and the metallic layers 7, 8 in this way. This is advantageous to restrain a warp of the insulating substrates 5, 6 due to the difference in coefficient of thermal expansion between the metallic electrodes 3, 4 and the insulating substrates 5, 6.

Such a slit 16 can be formed by performing press working, etching processing, etc. with respect to the metallic electrodes 3, 4 and the metallic layers 7, 8. In this example, the slit 16 is arranged both the metallic electrodes 3, 4 and the metallic layers 7, 8, but may be also arranged in only the metallic electrodes 3, 4, and may be also arranged in only the metallic layers 7, 8.

Further, in this example, the slit 16 is arranged in both the insulating substrates 5, 6. However, in accordance with necessity, it may be also set to a construction in which the slit 16 is arranged in the metallic electrode or the metallic layer in only one insulating substrate, and no slit is arranged in the metallic electrode and the metallic layer in the other insulating substrate.

Further, this embodiment mode can be executed by patterning the metallic electrodes 3, 4 and the metallic layers 7, 8, and can be applied to each of the above first to fourth embodiment modes.

Other Embodiment Modes

In each of the above embodiment modes, both the metallic electrodes 3, 4 as a pair have a laminating structure in which plural layers 3a, 3b, 4a, 4b are laminated in a low order of coefficient of thermal expansion from the outer face side to the inner face side. However, only one of the metallic electrodes 3, 4 is set to have such a laminating structure, and the other may be also set to a metallic electrode of a single layer as in the former case.

For example, in each semiconductor device shown in each of the above embodiment modes, there is also a case in which a cooling device comes in contact with only one of the metallic electrodes 3, 4 as a pair, and heat is radiated by an air cooling system without arranging the cooling device in the other. In such a case, only the metallic electrode on a side coming in contact with the cooling device is set to the above laminating structure, and the warp of the insulating substrate may be restrained.

In the case of such a laminating structure of only one side, the above slit 16 may be also arranged in only one of the metallic electrodes 3, 4 having the laminating structure, and may be also arranged in only the other of the metallic electrodes 3, 4 having no laminating structure, and may be also arranged in both the metallic electrodes 3, 4. This is because an effect using the slit 16 is shown irrespective of the existence of this laminating structure as mentioned above.

Further, in the case of the laminating structure of only one side, the terminal structure as shown in the above first to third embodiment modes may be adopted with respect to only one metallic electrode having the laminating structure, and a normal terminal structure may be adopted with respect to the other metallic electrode having no laminating structure.

Further, in this case, the above metallic layers 7, 8 arranged on the outer faces of the insulating substrates 5, 6 may be also arranged on only the outer face of the insulating substrate of one metallic electrode side having the laminating structure, and may be also arranged on only the outer face of the insulating substrate of the other metallic electrode side having no laminating structure, and may be also arranged in both the insulating substrates. This is because an effect using the metallic layers 7, 8 is shown irrespective of the existence of the laminating structure as mentioned above.

Further, in the case of this one side laminating structure, a construction (see the above FIGS. 5 and 6) for setting the planar size of the above metallic layers 7, 8 to be smaller than that of the insulating substrates 5, 6 and a construction (see the above FIGS. 7 and 8) for arranging the slit 16 in the metallic layers 7, 8 may be also applied to one or both of both the insulating substrates 5, 6 irrespective of whether the metallic electrodes 3, 4 have the laminating structure or not.

Further, in each of the above embodiment modes, the laminating structure of the metallic electrodes 3, 4 is a two-layer structure of the insulating substrate side layers 3a, 4a and the element side layers 3b, 4b, but may be also set to three layers or more if the layers are laminated in a low order of coefficient of thermal expansion from the outer face side as the insulating substrate side to the inner face side as the semiconductor element side.

For example, in the case of the metallic electrode of three layers, the layers may be laminated as in a cast iron layer, a pure iron layer and a copper system metallic layer from the outer face side to the inner face side, or may be also laminated as in an iron system metallic layer, a copper system metallic layer and an aluminum system metallic layer.

Further, in the above first embodiment mode, thermal stress applied to the insulating substrates 5, 6 is relaxed by arranging the above metallic layers 7, 8 in at least one of the respective insulating substrates 5, 6. However, these metallic layers 7, 8 may also not exist in both the insulating substrates 5, 6 in a certain case.

Further, the semiconductor device in each of the above embodiment modes is sealed by the resin mold 11, but may not be also sealed by the resin mold.

Further, as mentioned above, the heat sink block 10 is interposed between the IGBT 1 and the second metallic electrode 4, and has a role for securing the height between both these members 1, 4. However, the heat sink block 10 may not exist in each of the above embodiment modes if possible.

Further, the semiconductor element nipped by the pair of metallic electrodes 3, 4 may not be also the IGBT 1 and the FWD 2 mentioned above if the pair of metallic electrodes 3, 4 arranged on both faces can be used as electrodes. Further, the number of semiconductor elements may be also set to one and may be also set to three or more.

The above disclosure has the following aspects.

According to an aspect of the present disclosure, a semiconductor device includes: first and second metal electrodes having heat radiation property, wherein inner surfaces of metal electrodes face each other; a semiconductor element sandwiched between the first and second metal electrodes, wherein the semiconductor element is electrically connected to both inner surfaces of the electrodes; and first and second insulation substrates having heat radiation property, wherein the first insulation substrate is disposed on the first metal electrode, and opposite to the semiconductor element, and wherein the second insulation substrate is disposed on the second metal electrode, and opposite to the semiconductor element. Each of the first and second insulation substrates is made of ceramics. At least one of the first and second metal electrodes includes a plurality of layers, which are stacked in a direction parallel to a stacking direction of the electrodes, the semiconductor element and the insulation substrates. One layer disposed on a semiconductor element side has a thermal expansion coefficient, which is higher than that of another layer disposed on an insulation substrate side.

In the above device, warpage of the insulation substrate is limited, the warpage caused by difference of thermal expansion coefficient between the insulation substrate and the metal electrode.

Alternatively, at least one of the first and second metal electrodes may further include a slit. In this case, thermal stress generated in the metal electrode is limited by the slit.

Alternatively, one layer, which is nearest to the insulation substrate, may be made of iron series metal. Further, only one layer, which is nearest to the semiconductor element, may be electrically connected to an external circuit. In this case, another layer can be made of material other than iron, which has comparatively low conductivity, so that the another layer and the external circuit have excellent electric connection.

Alternatively, the device may further include a metallic layer disposed on at least one of the first and second insulation substrates. The metallic layer is opposite to the metal electrode, and the metallic layer is electrically insulated from the metal electrode. In this case, the metallic members, i.e., the metallic layer and the metal electrode, are arranged on both sides of the insulation substrate. Thus, thermal stress to the insulation substrate is much limited.

Alternatively, the metallic layer may have a thickness, which is smaller than a thickness of the metal electrode, which is opposite to the metallic layer. In this case, large amount of current can be flown through the metal electrode, and the comparative thin metallic layer has excellent heat radiation performance.

Alternatively, the metallic layer may have a planar area, which is smaller than a planar area of the insulation substrate, on which the metallic layer is disposed, and the metallic layer is completely disposed on the insulation substrate. In this case, the length between the periphery of the metallic layer and the periphery of the metal electrode is increased, so that electric insulation between the metallic layer and the metal electrode is improved.

Alternatively, the device may further include a resin mold for molding the metallic layer, the first and second metal electrodes, the semiconductor element, and the first and second insulation substrates. The metallic layer has a surface, which is exposed from the resin mold, and each of the first and second metal electrodes has a portion, which is exposed from the resin mold.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:

first and second metal electrodes having heat radiation property, wherein inner surfaces of metal electrodes face each other;

a semiconductor element sandwiched between the first and second metal electrodes, wherein the semiconductor element is electrically connected to both inner surfaces of the electrodes; and first and second insulation substrates having heat radiation property, wherein the first insulation substrate is disposed on the first metal electrode, and opposite to the semiconductor element, and wherein the second insulation substrate is disposed on the second metal electrode, and opposite to the semiconductor element, wherein each of the first and second insulation substrates is made of ceramics, at least one of the first and second metal electrodes includes a plurality of layers, which are stacked in a direction parallel to a stacking direction of the electrodes, the semiconductor element and the insulation substrates, and one layer disposed on a semiconductor element side has a thermal expansion coefficient, which is higher than that of another layer disposed on an insulation substrate side.

2. The device according to claim 1, wherein each of the first and second metal electrodes includes a plurality of layers, which are stacked in a direction parallel to the stacking direction.

3. The device according to claim 1, wherein at least one of the first and second metal electrodes further includes a slit.

4. The device according to claim 1, wherein one layer, which is nearest to the insulation substrate, is made of iron series metal.

5. The device according to claim 4, wherein another layer, which is nearest to the semiconductor element, is made of copper, copper alloy, aluminum or aluminum alloy.

6. The device according to claim 5, wherein the insulation substrate is made of alumina, aluminum nitride, or silicon nitride.

7. The device according to claim 4, wherein only one layer, which is nearest to the semiconductor element, is electrically connected to an external circuit.

8. The device according to claim 7, wherein the one layer nearest to the semiconductor element is electrically connected to a conductive member through a conductive joining member, and the one layer is electrically connected to the external circuit through the conductive member.

9. The device according to claim 7, wherein the one layer nearest to the semiconductor element is electrically connected to a conductive member through a bonding wire, and the one layer is electrically connected to the external circuit through the conductive member.

10. The device according to claim 1, further comprising:

a metallic layer disposed on at least one of the first and second insulation substrates, wherein the metallic layer is opposite to the metal electrode, and the metallic layer is electrically insulated from the metal electrode.

11. The device according to claim 10, wherein
the metallic layer has a thickness, which is smaller than a thickness of the metal electrode, which is opposite to the metallic layer.

12. The device according to claim 10, wherein
the metallic layer has a planar area, which is smaller than a planar area of the insulation substrate, on which the metallic layer is disposed, and
the metallic layer is completely disposed on the insulation substrate.

13. The device according to claim 10, wherein
the metallic layer has a slit.

14. The device according to claim 10, further comprising:
a resin mold for molding the metallic layer, the first and second metal electrodes, the semiconductor element, and the first and second insulation substrates, wherein
the metallic layer has a surface, which is exposed from the resin mold, and
each of the first and second metal electrodes has a portion, which is exposed from the resin mold.

* * * * *